United States Patent
Oikawa et al.

(10) Patent No.: US 11,538,678 B2
(45) Date of Patent: Dec. 27, 2022

(54) DEPOSITION METHOD

(71) Applicant: Tokyo Electron Limited, Tokyo (JP)

(72) Inventors: Masami Oikawa, Iwate (JP); Yuya Takamura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 207 days.

(21) Appl. No.: 17/118,874

(22) Filed: Dec. 11, 2020

(65) Prior Publication Data

US 2021/0193455 A1 Jun. 24, 2021

(30) Foreign Application Priority Data

Dec. 24, 2019 (JP) .............................. JP2019-233163

(51) Int. Cl.
*H01L 21/02* (2006.01)
*C23C 16/455* (2006.01)
*C23C 16/34* (2006.01)

(52) U.S. Cl.
CPC ........ *H01L 21/0228* (2013.01); *C23C 16/345* (2013.01); *C23C 16/45527* (2013.01); *C23C 16/45557* (2013.01); *H01L 21/0217* (2013.01); *H01L 21/02211* (2013.01)

(58) Field of Classification Search
None
See application file for complete search history.

(56) References Cited

U.S. PATENT DOCUMENTS 11,322,370 B1 * 5/2022 Itatani ............... C23C 16/45544

FOREIGN PATENT DOCUMENTS

JP 2007-042823 2/2007

* cited by examiner

*Primary Examiner* — Asok K Sarkar
(74) *Attorney, Agent, or Firm* — IPUSA, PLLC

(57) ABSTRACT

A deposition method according to one aspect of the present disclosure includes performing multiple execution cycles serially. Each of the multiple execution cycles includes: supplying a raw material gas into a process chamber; and supplying a reactant gas that reacts with the raw material gas. Among the multiple execution cycles, at least one execution cycle includes adjusting a pressure in the process chamber without supplying the raw material gas, and the adjusting of the pressure is performed prior to the supplying of the raw material gas.

10 Claims, 9 Drawing Sheets

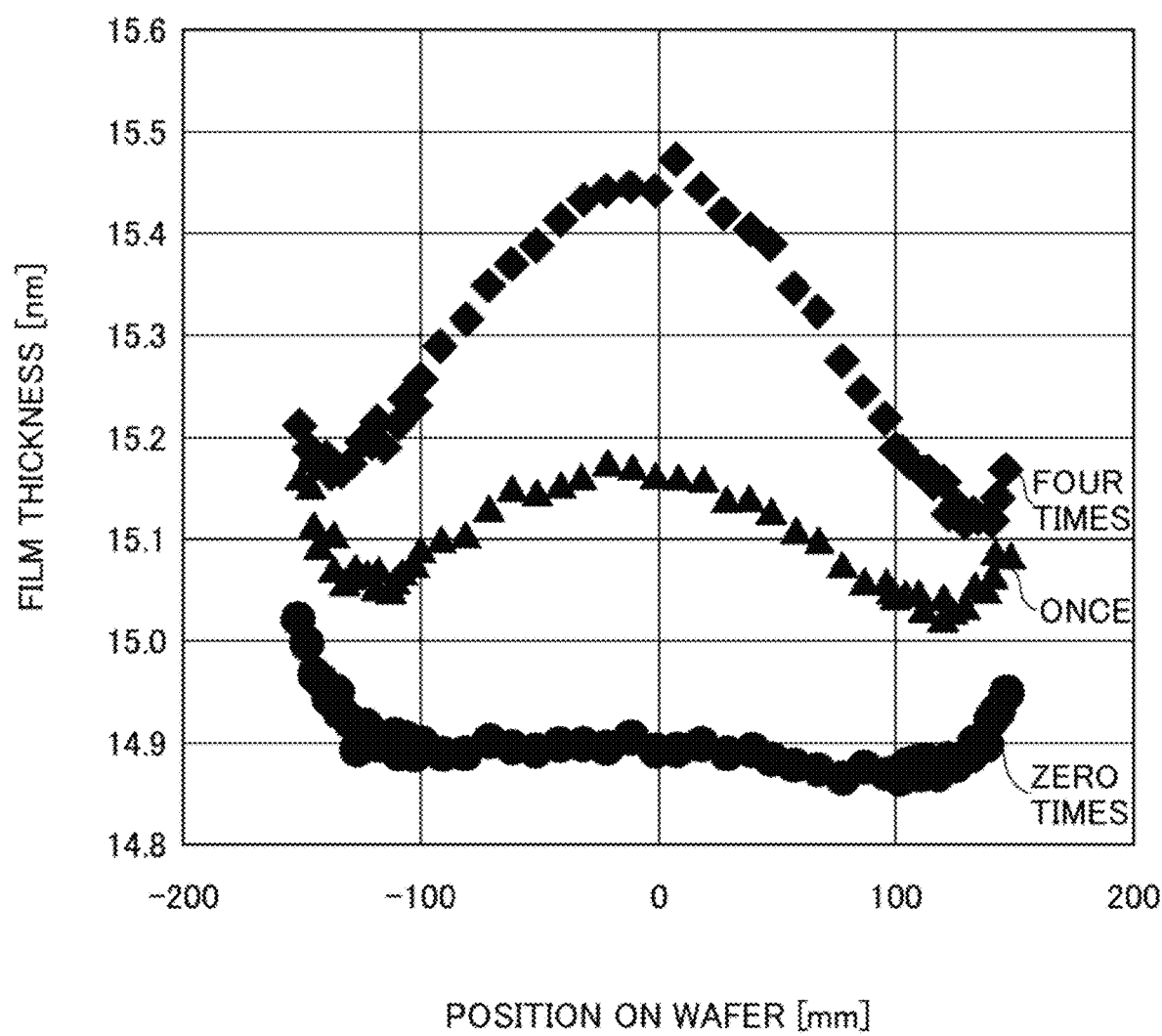

DEPOSITION METHOD

CROSS-REFERENCE TO RELATED APPLICATIONS

This patent application is based upon and claims priority to Japanese Patent Application No. 2015-233163 filed on Dec. 24, 2019, the entire contents of which are incorporated herein by reference.

TECHNICAL FIELD

The present disclosure relates to deposition methods.

BACKGROUND

A deposition method for forming a thin film is known, in which the thin film is formed by alternately supplying a raw material gas and a reactant gas to a process chamber that is exhausted by a vacuum exhaust system including a valve mechanism (see Patent Document 1, for example). In this deposition method, in forming a thin film, an opening degree of the valve in the valve mechanism when supplying the raw material gas is set to be smaller than that of the valve when not supplying the raw material gas (see Patent Document 1, for example).

RELATED ART DOCUMENT

Patent Document

[Patent Document 1] Japanese Laid-open Patent Application Publication No. 2007-042823

SUMMARY

The present disclosure provides a technique for controlling in-plane distribution of film thickness.

A deposition method according to one aspect of the present disclosure includes performing multiple execution cycles serially. Each of the multiple execution cycles includes: supplying a raw material gas into a process chamber; and supplying, into the process chamber, a reactant gas that reacts with the raw material gas. Among the multiple execution cycles, at least one execution cycle includes adjusting a pressure in the process chamber without supplying the raw material gas, and the adjusting of the pressure is performed prior to the supplying of the raw material gas.

BRIEF DESCRIPTION OF THE DRAWINGS

FIG. 8 is a graph illustrating evaluation results of Example 3; and

DETAILED DESCRIPTION OF EMBODIMENTS

Figure 1:
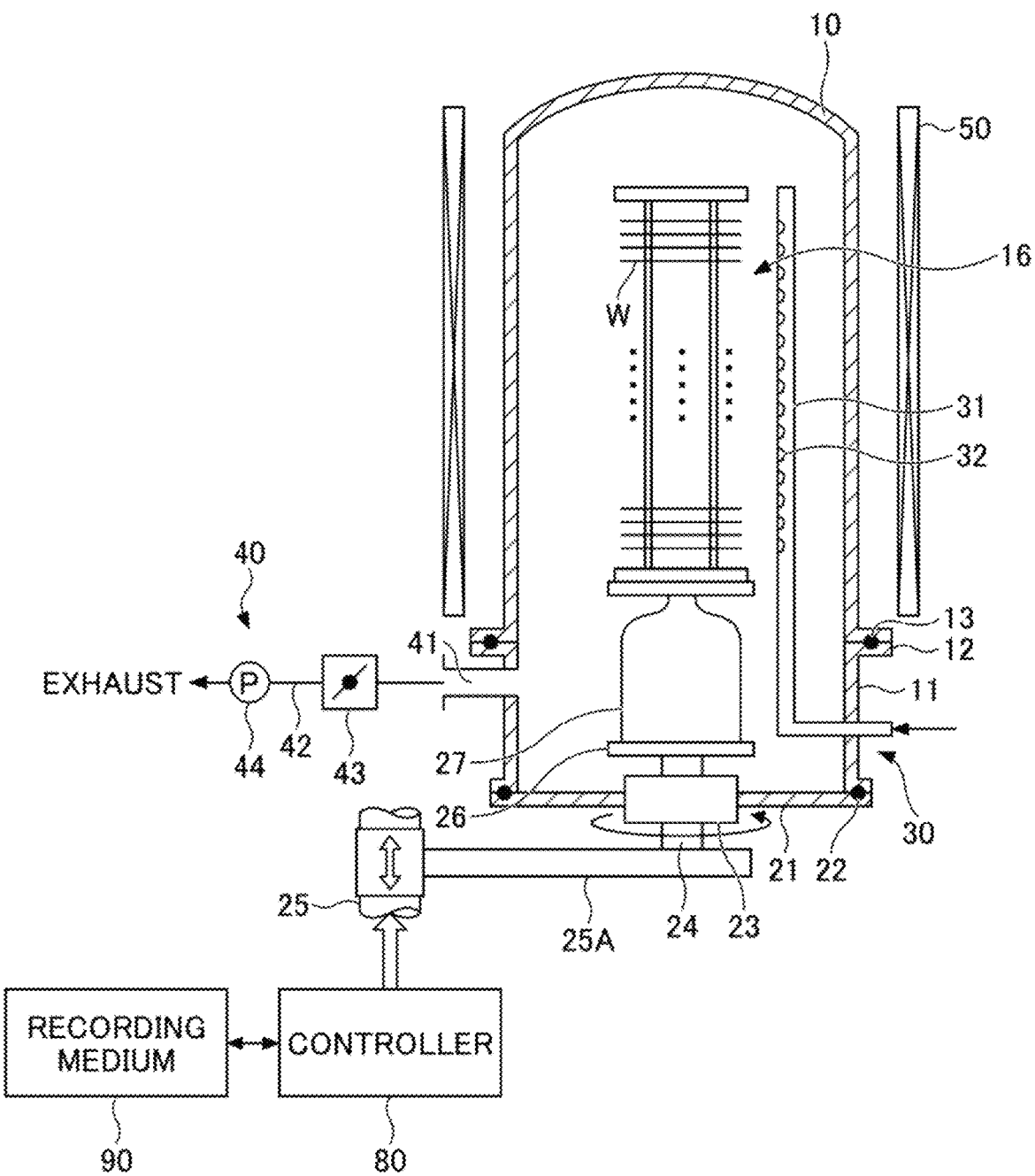
FIG. 1 is a schematic diagram illustrating an example of the configuration of a deposition apparatus according to an embodiment.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

(Deposition Apparatus)

FIG. 1 is a schematic diagram illustrating an example of the configuration of a deposition apparatus according to an embodiment. As illustrated in FIG. 1, the deposition apparatus 1 includes a process chamber 10, a gas supply section 30, an exhaust section 40, a heater 50, a controller 80, and the like.

The process chamber 10 is capable of decompressing the interior of the process chamber 10, and accommodates one or more semiconductor wafers (hereinafter referred to as a "wafer W") that is a substrate. The process chamber 10 has a shape of a cylinder having a ceiling, and the lower end of the process chamber 10 is opened. The process chamber 10 is formed of a heat-resistant material such as quartz.

The lower end of the process chamber 10 is supported by a cylindrical manifold 11 formed of, for example, stainless steel. A flange 12 is formed on the upper end of the manifold 11. The lower end of the process chamber 10 is disposed on the flange 12, and is supported by the flange 12. A sealing member 13, such as an O-ring, is interposed between the flange 12 and the lower end of the process chamber 10 to keep the interior of the process chamber 10 airtight.

To an opening at the lower end of the manifold 11, a lid 21 is hermetically attached via a sealing member 22 such as an O-ring, to airtightly seal the opening at the lower end of the process chamber 10, i.e., the opening of the manifold 11. The lid 21 is formed of, for example, stainless steel.

A rotating shaft 24, which rotatably supports a wafer boat 16, is attached to the center of the lid 21 via a ferrofluidic seal 23. The lower portion of the rotating shaft 24 is rotatably supported on an arm 25A of a lifting mechanism 25 including a boat elevator.

A rotary plate 26 is provided at the upper end of the rotating shaft 24, and the wafer boat 16 for holding the wafer W is disposed on the rotary plate 26 via a heat insulating platform 27 made of quartz. Thus, by actuating the lifting mechanism 25, the lid 21 and the wafer boat 16 are moved up and down together, to allow the wafer boat 16 to be inserted into and removed from the process chamber 10. The wafer boat 16 is a substrate holding device that can be accommodated in the process chamber 10 and that holds multiple wafers W substantially horizontally while the wafers W are arranged at intervals in a vertical direction.

The gas supply section 30 is provided at the manifold 11. The gas supply section 30 introduces gas, such as a deposition gas or a purge gas, into the process chamber 10. The gas supply section 30 includes a gas nozzle 31.

The gas nozzle 31 is made of quartz for example, and is provided within the process chamber 10 along its longitudinal direction. A lower end portion of the gas nozzle 31 is bent in an L-shape, and is supported by the manifold 11 by penetrating the manifold 11. Multiple gas holes 32 are formed in the gas nozzle 31 along its longitudinal direction, to discharge gas horizontally through the gas holes 32. The gas holes 32 are arranged, for example, at the same interval as that of the wafers W supported by the wafer boat 16. The gas nozzle 31 is a nozzle for supplying gas, such as deposition gas or a purge gas, and supplies the gas into the process chamber 10 while controlling its flow rate as needed.

The deposition gas is a gas for forming a film on the wafer W, and is selected according to a type of the film to be deposited.

In a case in which a silicon nitride film (SiN film) is formed, a silicon raw material gas and a nitriding gas may be used as the deposition gas. Examples of the silicon raw material gas include a chlorine-containing silane-based gas such as dichlorosilane (DCS) and hexachlorodisilane (HCD), and an aminosilane-based gas such as diisopropylaminosilane (DIPAS), tris(dimethylamino)silane (3DMAS), tetrakis(dimethylamino)silane (4DMAS), and bis(tertiary-butyl-amino)silane (BTBAS). An example of the nitriding gas includes $NH_3$ gas.

In a case in which a silicon oxide film ($SiO_2$ film) is formed, the silicon raw material gas and an oxidant gas may be used as the deposition gas. Examples of the silicon raw material gas include the above-described chlorine-containing silane-based gas and an aminosilane-based gas. Examples of the oxidant gas include $O_2$ gas, $O_2$ gas, $CO_2$ gas, NO gas, $N_2O$ gas, and $H_2O$ gas.

In a case in which a boron-containing silicon nitride film (SiBN film) is formed, a silicon raw material gas, a boron-containing gas, and a nitriding gas may be used as the deposition gas. Examples of the silicon raw material gas include the above-described chlorine-containing silane-based gas and the aminosilane-based gas. An example of the boron-containing gas includes $BCl_3$ gas. An example of the nitriding gas includes $NH_3$ gas.

In a case in which a metal nitride film or a metal oxide film is formed, a metal raw material gas a nitriding gas, and an oxidant gas may be used as the deposition gas. Examples of the metal raw material gas include $AlCl_3$ gas and trimethylaluminum (TMA) gas.

The purge gas is a gas for purging the deposition gas remaining in the process chamber 10. Examples of the purge gas include an inert gas such as nitrogen ($N_2$) gas and argon (Ar) gas.

Although the example of FIG. 1 illustrates a case in which the gas supply section 30 has a single gas nozzle 31, the configuration of the gas supply section 30 is not limited thereto. For example, the gas supply section 30 may include multiple gas nozzles.

The exhaust section 40 exhausts gases discharged from a gas outlet 41 of the process chamber 10. The gas outlet 41 is formed in the upper portion of the side wall of the manifold 11. An exhaust passage 42 is connected to the gas outlet 41 A pressure regulating valve 43 and a vacuum pump 44 are sequentially interposed in the exhaust passage 42, to evacuate the process chamber 10. The pressure regulating valve 43 is a valve capable of adjusting exhaust conductance of the exhaust passage 42, and the pressure regulating valve 43 may be, for example, an automatic pressure control (APC) valve.

The heater 50 is provided around the process chamber 10. The heater 50 has a cylindrical shape to cover the process chamber 10. The heater 50 heats the wafer W in the process chamber 10.

The controller 30 controls operations of the deposition apparatus 1. The controller 80 may be, for example, a computer. A computer program for controlling the overall operation of the deposition apparatus 1 is stored in a recording medium 90. Examples of the recording medium 90 may include a flexible disk, a compact disc, a hard disk drive, a flash memory, and a digital versatile disc (DVD).

<Deposition Method>

A deposition method according to the present embodiment will be described. In the following example, an SiBN film is formed by atomic layer deposition (ALD) using DCS gas as a silicon raw material gas, $BCl_3$ gas as a boron-containing gas, $NH_3$ gas as a nitriding gas, and $N_2$ gas as a purge gas. However, the film formed by the deposition method according to the present embodiment is not limited to an SiBN film, and may be, for example, a silicon nitride film, a silicon oxide film, a metal nitride film, or a metal oxide film.

Figure 2:
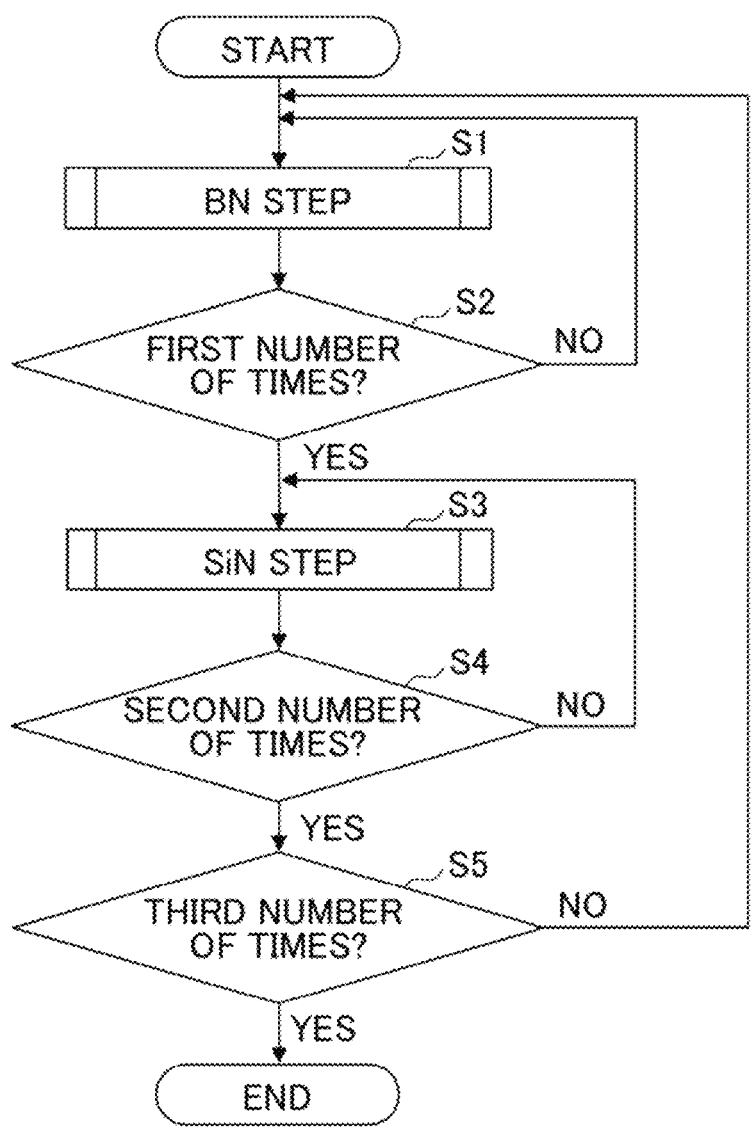
FIG. 2 is a flowchart illustrating a method of forming SiBN film according to the embodiment.

FIG. 2 is a flowchart illustrating a method of forming an SiBN film according to the present embodiment. As illustrated in FIG. 2, the method of forming an SiBN film according to the present embodiment includes steps S1 to S5. The method of forming an SiBN film according to the present embodiment is performed, for example, by the controller 80 controlling each component of the deposition apparatus 1.

First, the wafer boat 16, on which multiple wafers W are mounted, is loaded into the process chamber 10 controlled to a predetermined temperature, by moving up the wafer boat 16 from below the process chamber 10. Further, by closing the opening at the lower end of the manifold 11 with the lid 21, the interior of the process chamber 10 is made to be an enclosed space. An example of the wafers W is a wafer of 300 mm in diameter.

Thereafter, the process chamber 10 is evacuated to maintain a pressure at the process pressure, and electric power supplied to the heater 50 is controlled to increase the temperature of the wafers and to maintain the temperature of the wafers at the process temperature. Then, while rotating the wafer boat 16, the deposition process including steps S1 to S5 is started.

In step S1, the controller 30 controls each component of the deposition apparatus 1 to perform a BN step. The BN step supplies $BCl_3$ gas and $NH_3$ gas alternately from the gas nozzle 31 into the process chamber 10 to form a BN film. Details of the BN step are described below.

In step 32, the controller 80 determines whether the BN step has been performed the first number of times or more than the first number of times. The first number may be, for example, a number between 1 and 10. If it is determined in step S2 that the BN step has been performed the first number of times or more than the first number of times, the controller 80 advances the deposition process to step S3. Meanwhile, if it is determined in step S2 that the BN step has not beer, performed the first number of times, the controller 80 returns the deposition process to step S1.

In step S3, the controller 80 controls each component of the deposition apparatus 1 to perform an SiN step. The SiN step supplies DCS gas and $NH_3$ gas alternately from the gas nozzle 31 into the process chamber 10 to form an SiN film. Details of the SiN step are described below.

In step S4, the controller 80 determines whether the SiN step has been performed the second number of times or mere than the second number of times. The second number may be, for example, a number between 1 and 10. If it is determined in step S4 that the SiN step has been performed the second number of times or more than the second number of times, the controller 80 advances the deposition process to step S5. Meanwhile, if it is determined in step S4 that the S11 step has not been performed the second number of times, the controller 80 returns the deposition process to step S3.

In step S5, the controller 80 determines whether the steps S1 to S4 are executed the third number of times or more than the third number of times. The third number is set according to the thickness of an SiBN film to be formed. If it is determined in step S5 that steps S1 to S4 have been executed the third number of times or more than the third number of times, the controller 80 terminates the deposition process. Meanwhile, if it is determined in step S5 that steps S1 to S4 have not been performed the third number of times, the controller 80 returns the deposition process to step S1.

As described above, in the method of forming an SiBN film according to the present embodiment, an SiBN film of the desired thickness can be formed by repeating execution of a cycle, which includes the first number of repeated executions of the BN step and the second number of repeated executions of the SiN step, the third number of times.

Figure 3:
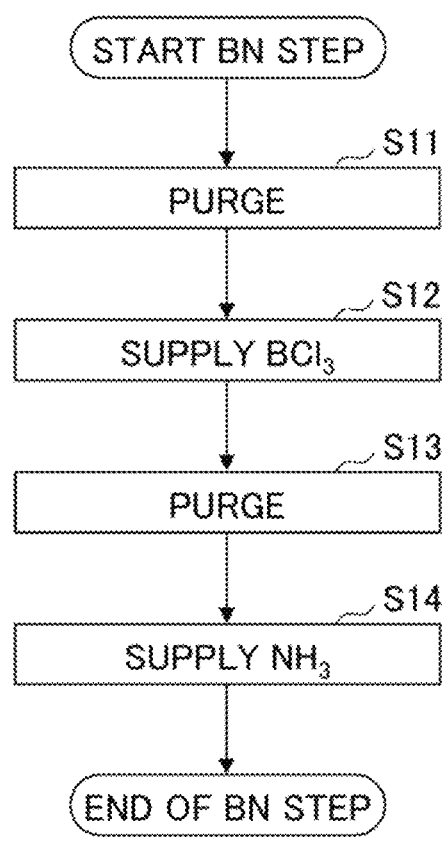
FIG. 3 is a flowchart illustrating an example of a BN step.

FIG. 3 is a flowchart illustrating an example of the BN step. As illustrated in FIG. 3, the BN step is a process of performing a purging step S11, a $BCl_3$ gas supplying step 312, a purging step S13, and a $NH_3$ gas supplying step S14 in this order.

In the purging step S11, the controller 80 controls the gas supply section 30 and the exhaust section 40 to supply $N_2$ gas from the gas holes 32 of the gas nozzle 31 into the process chamber 10 while evacuating the process chamber 10. This removes residual gas from the process chamber 10. For example, in the purging step S11, the controller 80 controls a degree of the valve opening of the APC valve to a fully opened state.

In the $BCl_3$ gas supplying step S12, the controller 80 controls the gas supply section 30 to supply $BCl_3$ gas from the gas holes 32 of the gas nozzle 31 into the process chamber 10. This causes $BCl_3$ gas to be adsorbed on the wafers W.

In the purging step S13, the controller 80 controls the gas supply section 30 and the exhaust section 40 to supply $N_2$ gas from the gas holes 32 of the gas nozzle 31 into the process chamber 10 while evacuating the process chamber 10. This removes residual gas from the process chamber 10. For example, in the purging step S13, the controller 80 controls the degree of the valve opening of the APC valve to a fully opened state.

In the $NH_3$ gas supplying step S14, the controller 80 controls the gas supply section 30 to supply $NH_3$ gas from the gas holes 32 of the gas nozzle 31 into the process chamber 10. This nitrides $BCl_3$ gas adsorbed on the wafers W.

By performing steps S11 through S14 as described above, a unit of BN film is deposited on the wafers W.

Figure 4:
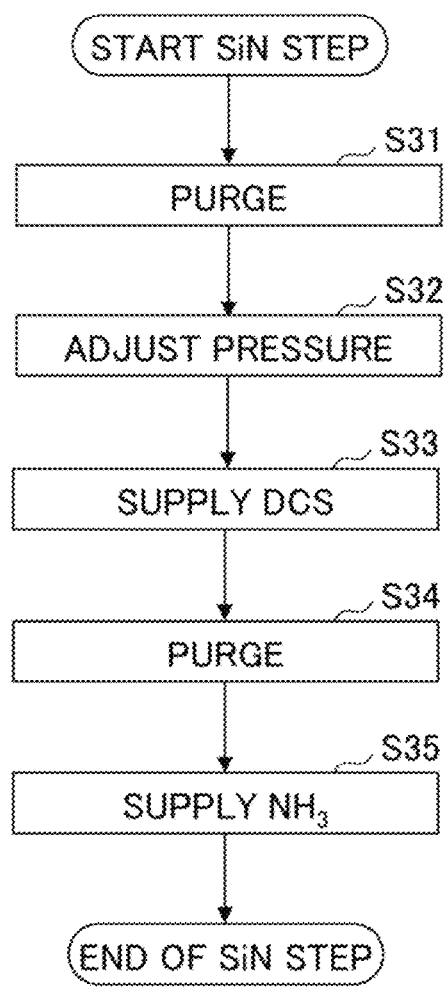
FIG. 4 is a flowchart illustrating an example of an SiN step.
Figure 5:
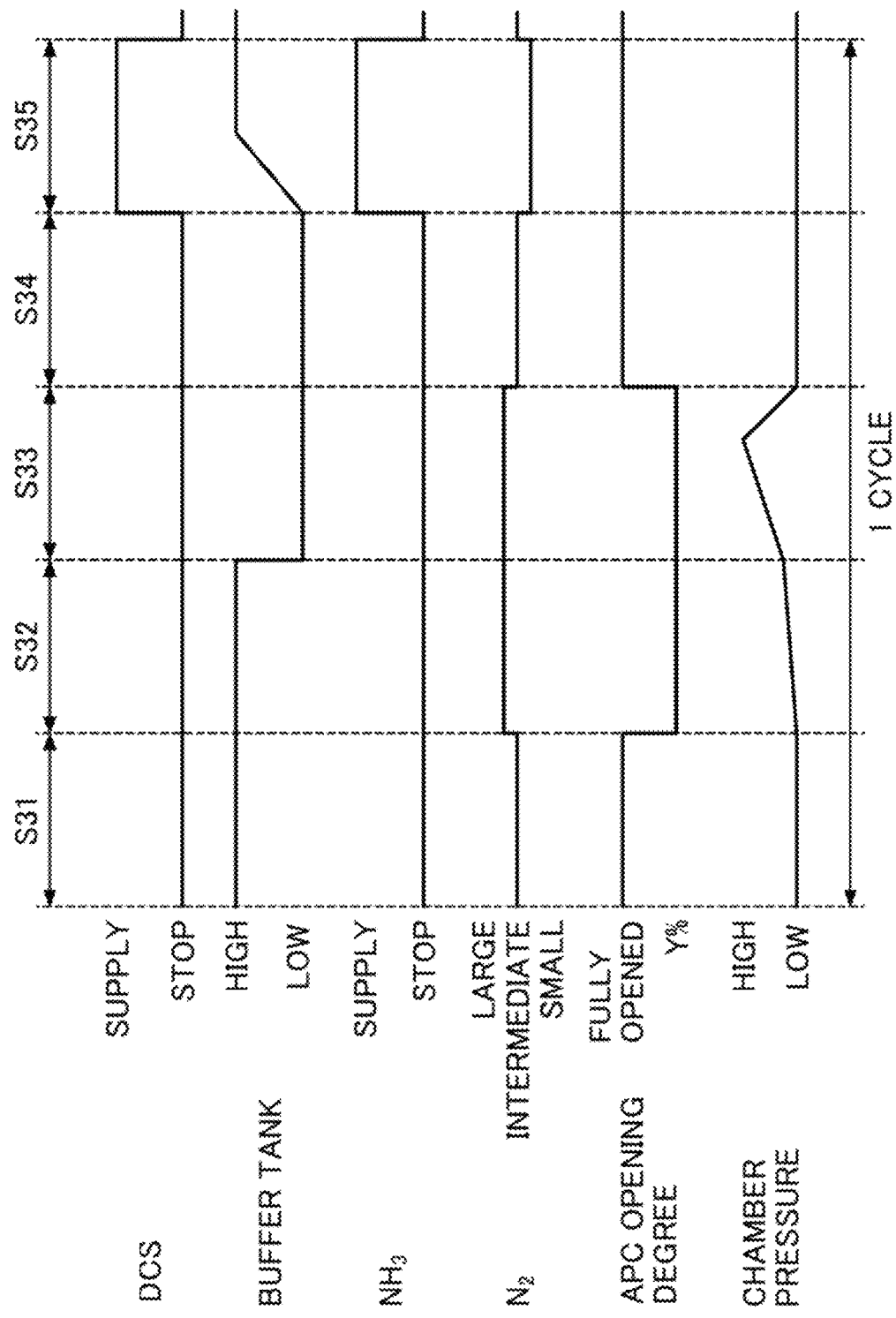
FIG. 5 is a diagram illustrating an example of a gas supply sequence in the SiN step.

FIG. 4 is a flowchart illustrating an example of the SiN step. FIG. 5 is a diagram illustrating an example of a gas supply sequence in the SiN step. As illustrated in FIG. 4, the SiN step is a process of performing a purging step S31, a pressure adjusting step S32, a DCS gas supplying step S33, a purging step S34, and a $NH_3$ gas supplying step S35 in this order.

In the purging step S31, the controller 80 controls the gas supply section 30 and the exhaust section 40 to supply $N_2$ gas from the gas holes 32 of the gas nozzle 31 into the process chamber 10 while evacuating the process chamber 10. This removes residual gas from the process chamber 10. For example, in the purging step S31, the controller 80 controls the degree of the valve opening of the APC valve to a fully opened state. The flow rate of $N_2$ gas in the purging step S31 may be, for example, less than a flow rate of $N_2$ gas in the DCS gas supplying step S33 and greater than a flow rate of $N_2$ gas in the $NH_3$ gas supplying step S35.

In the pressure adjusting step S32, the controller 80 adjusts the pressure in the process chamber 10 without supplying DCS and $NH_3$ gases. The controller 80 controls the degree of the valve opening of the APC valve, which is an example of the pressure regulating valve 43, to a degree smaller than the degree of the valve opening of the APC valve in the purging step S31, as illustrated in FIG. 5 for example. This gradually Increases the pressure in the process chamber 10 in the pressure adjusting step S32, as illustrated in FIG. 5. In addition, it is preferable that the degree of the valve opening of the APC valve in the pressure adjusting step S32 is equal to the degree of the valve opening of the APC valve in the DCS gas supplying step S33, which is Y %.

In the DCS gas supplying step S33, the controller 80 controls the gas supply section 30 to supply DCS gas from the gas holes 32 of the gas nozzle 31 into the process chamber 10. This causes DCS gas to be adsorbed on the wafers W. DCS gas is temporarily stored in a buffer tank (not illustrated in FIG. 1), and the DCS gas pressurized in the buffer tank is supplied into the process chamber 10 in the DCS gas supplying step S33, as illustrated in FIG. 5 for example. That allows DCS gas to be stably supplied into the process chamber 10 at a relatively high flow rate. In the DCS gas supplying step S33, the controller 80 controls the degree of the valve opening of the APC valve to Y %. Y % may be, for example, a value ranging from 0% to 20%.

In the purging step S34, the controller 80 controls the gas supply section 30 and the exhaust section 40 to supply $N_2$ gas from the gas holes 32 of the gas nozzle 31 into the process chamber 10 while evacuating the process chamber 10. This removes residual gas from the process chamber 10. For example, in the purging step S34, the controller 30 controls the degree of the valve opening of the APC valve to a fully opened state.

In the $NH_2$ gas supplying step S35, the controller 80 controls the gas supply section 30 to supply $NH_2$ gas from the gas holes 32 of the gas nozzle 31 into the process chamber 10. This nitrides DCS gas adsorbed on the wafers W. Also, in the $NH_2$ gas supplying step S35, the controller 30 controls the gas supply section 30 to supply DCS gas from a source of DCS gas into the buffer tank. This causes DCS gas to be temporarily stored in the buffer tank and pressurized in the buffer tank.

By performing steps S31 to S35 in this manner, a unit of SiN film is deposited on the wafers W.

EXAMPLES

In the following, results of experiments for confirming an effect of the method of forming an SiBN film according to the present embodiment will be described.

Example 1

In Example 1, in-plane distribution of the thickness of an SiBN film formed on the wafer W was evaluated when the deposition process including the aforementioned steps S1 to S5 was performed while rotating the wafer boat 16. In Example 1, the in-plane distribution of the thickness of an SiBN film formed on the wafer W was evaluated while changing time for the pressure adjusting step S32 included in the SiN step, in Example 1, the time for the pressure adjusting step S32 was set to 0 seconds, 1 second, or 2 seconds. In Example 1, DCS gas was used as a silicon raw material gas, $BCl_3$ gas was used as a boron-containing gas, $NH_2$ gas was used as a nitriding gas, and $N_2$ gas was used as a purge gas. Also, in Example 1, a silicon wafer having a diameter of 300 mm was used as the wafer W.

Figure 6:
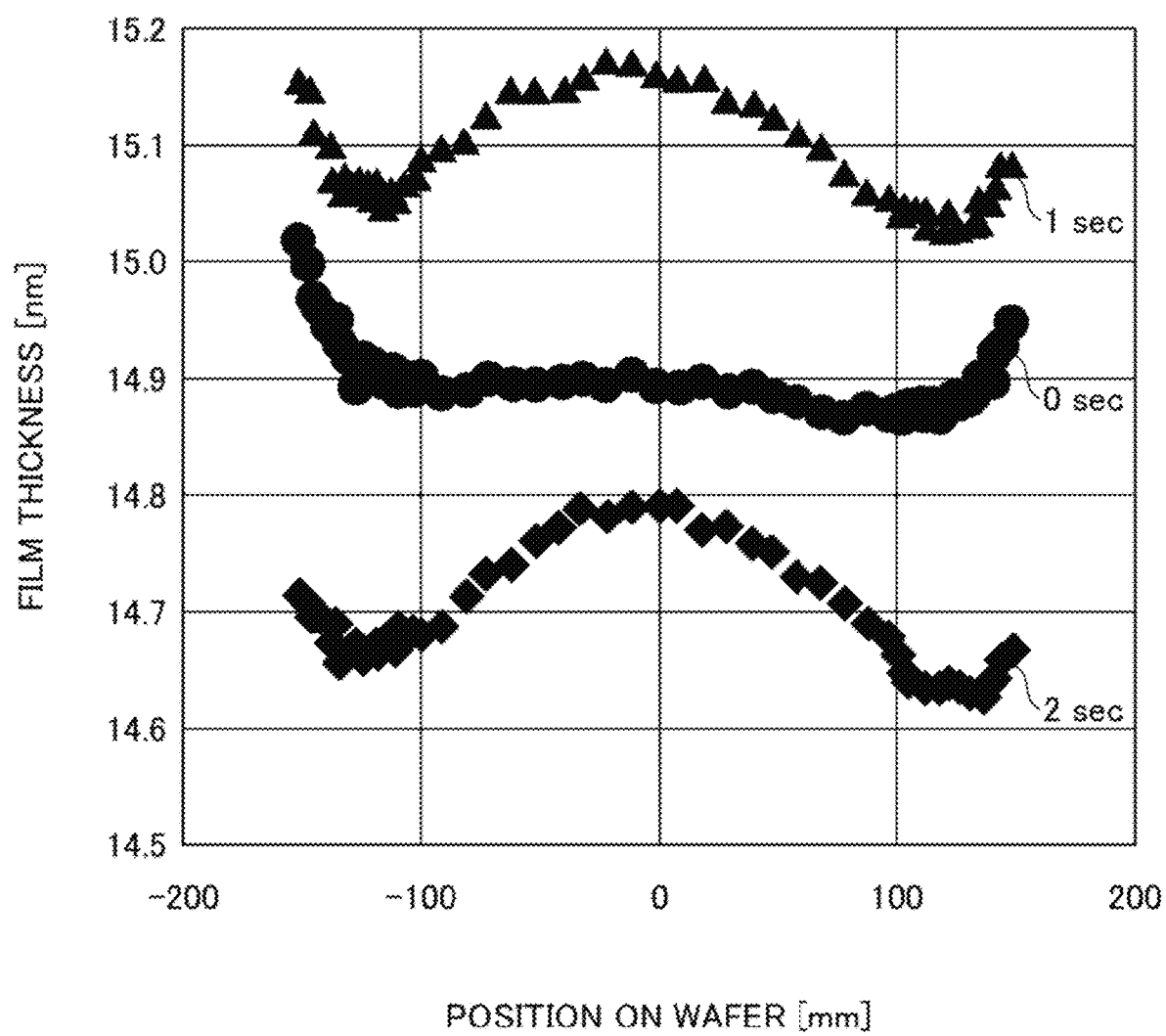
FIG. 6 is a graph illustrating evaluation results of Example 1.

FIG. 6 is a graph illustrating evaluation results of Example 1, which illustrates an example of the relationship between the time for the pressure adjusting step (step S32) and in-plane distribution of the thickness of an SiBN film. In FIG. 6, the horizontal axis indicates a position on a wafer [mm], and the vertical axis indicates a film thickness [nm]. The position on a wafer represents a position in the radial direction of the wafer W. 0 mm of the position on a wafer indicates the center of the wafer W, and −150 mm and 150 mm of the position on a wafer indicates the circumference of the wafer W. In FIG. 6, results when time for the pressure adjusting step S32 was 0 seconds are illustrated by circular marks, results when the time was 1 second are illustrated by triangle marks, and results when the time was 2 seconds are illustrated by diamond marks.

As illustrated in FIG. 6, by changing the time for the pressure adjusting step S32, it can be seen that the in-plane distribution of the thickness of an SiBN film formed on the wafer W is changed. Specifically, in a case in which the time for the pressure adjusting step S32 is 0 seconds, a dish-shaped distribution in which the thickness of an SiBN film at the center of the wafer W is smaller, than that at the outer periphery of the wafer W is illustrated. In contrast, in a case in which the time for the pressure adjusting step S32 is 1 second, a convex-shaped distribution in which the thickness of an SiBN film is large at the center of the wafer W is illustrated. In addition, in a case in which the time for the pressure adjusting step S32 is 2 seconds, a convex-shaped distribution in which the thickness of an SiBN film at the center of the wafer W is larger than that in a case in which the time for the pressure adjusting step S32 is 1 second is illustrated.

From the above results, it can be said that in-plane distribution of the thickness of an SiBN film can be controlled by executing the pressure adjusting step S32 before the DCS gas supplying step S33 and by adjusting time for the pressure adjusting step S32.

Example 2

In Example 2, in-plane distribution of the thickness of an SiBN film formed on the wafer W was evaluated when the deposition process including the aforementioned steps S1 to S5 was performed without rotating the wafer boat 16. In Example 2, evaluation was performed in the following two cases: a case in which the time for the pressure adjusting step S32 was 0 seconds, and a case in which the time for the pressure adjusting step S32 was 1 second. In Example 2, DCS gas was used as a silicon raw material gas, BCl$_3$ gas was used as a boron-containing gas, NH$_3$ gas was used as a nitriding gas, and N$_2$ gas was used as a purge gas. Also, a silicon wafer having a diameter of 300 mm was used as the wafer W.

Figure 7A:
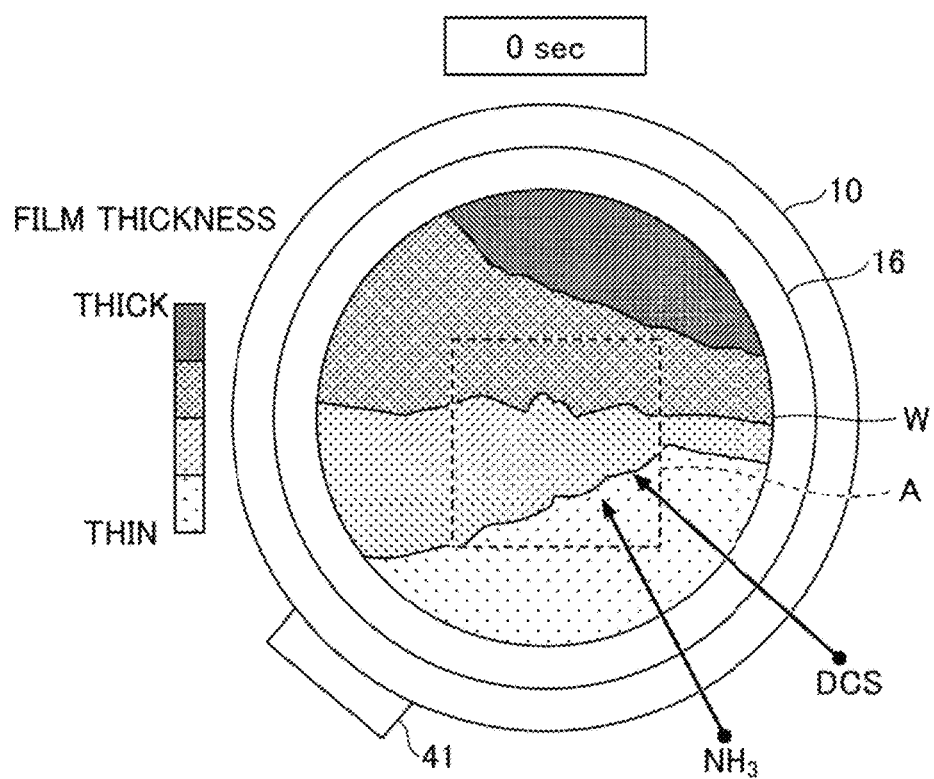
FIGS. 7A and 7B are diagrams illustrating evaluation results of Example 2.
Figure 7B:
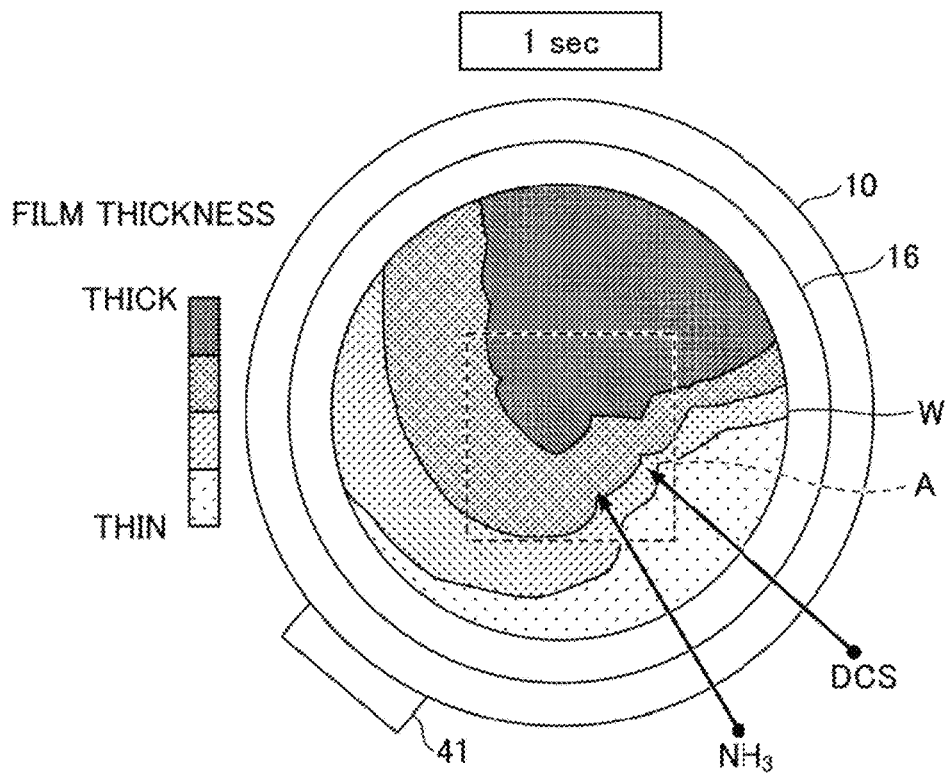

FIGS. 7A and 7B are diagrams illustrating results of the evaluation of Example 2, which illustrates an example of the relationship between the time for the pressure adjusting step (step 332) and in-plane distribution of the thickness of an SiBN film. FIG. 7A illustrates a case in which the time for the pressure adjusting step S32 is 0 seconds, and FIG. 7B illustrates a case in which the time for the pressure adjusting step 332 is 1 second.

As illustrated in FIGS. 7A and 7B, by setting the time for the pressure adjusting step 332 to 1 second, it can be seen that the thickness of an SiBN film in the central region A of the wafer W becomes greater than that in a case in which the time for the pressure adjusting step S32 is 0 seconds.

From the above results, it is possible to control in-plane distribution of the thickness of an SiBN film by executing the pressure adjusting step S32 and by adjusting time for the pressure adjusting step S32 before the DCS gas supplying step S33.

Example 3

In Example 3, in-plane distribution of the thickness of an SiBN film formed on the wafer W was evaluated while changing the number of times of executing the pressure adjusting step S32 included in the SiN steps in the method of forming an SiBN film according to the above-described embodiment. In Example 3, the second number, which is the number of executions of step S3 (i.e., SiN step), was set to 4, and evaluation was performed in the following three cases: a case in which the number of executions of the pressure adjusting step S32 was 0 during four-times execution of the SiN step, a case in which the number of executions of the pressure adjusting step S32 was 1 during four-times execution of the SiN step, and a case in which the number of executions of the pressure adjusting step S32 was 4 during four-times execution of the SiN step. In Example 3, DCS gas was used as a silicon raw material gas, BCl$_3$ gas was used as a boron-containing gas, NH$_3$ gas was used as a nitriding gas, and N$_2$ gas was used as a purge gas. Also, a silicon wafer having a diameter of 300 mm was used as the wafer W.

FIG. 3 is a graph illustrating evaluation results of Example 3, which illustrates an example of the relationship between the number of executions of the pressure adjusting step S32 and in-plane distribution of the thickness of an SiBN film. In FIG. 8, the horizontal axis indicates a position on a wafer [mm], and the vertical axis indicates a film thickness [nm]. The position on a wafer represents a position in the radial direction of the wafer W. 0 mm of the position on a wafer indicates the center of the wafer W, and −150 mm and 150 mm of the position on a wafer indicates the circumference of the wafer W. In FIG. 8, results when the number of times of executing the pressure adjusting step S32 is zero are illustrated by circular marks, results when the number of times is 1 are illustrated by triangle marks, and results when the number of times is 4 are illustrated by diamond marks.

As illustrated in FIG. 8, by changing the number of executions of the pressure adjusting step S32, it can be seen that in-plane distribution of the thickness of an SiBN film formed on the wafer W is changed. Specifically, in a case in which the number of executions of the pressure adjusting step S32 is zero, a dish-shaped distribution in which the thickness of an SiBN film at the center of the wafer W is smaller than that at the outer periphery of the wafer W is illustrated. In contrast, in a case in which the number of executions of the pressure adjusting step S32 is one, a convex-shaped distribution in which the thickness of an SiBN film is large at the center of the wafer W is illustrated. In addition, in a case in which the number of executions of the pressure adjusting step S32 is four, a convex-shaped distribution in which the thickness of an SiBN film at the center of the wafer W is larger than that in a case in which the number of executions of the pressure adjusting step S32 is one is illustrated.

From the above results, it can be said that the in-plane distribution of the thickness of an SiBN film can be controlled by executing the pressure adjusting step S32 before the DCS gas supplying step S33 and by adjusting the number of times when the pressure adjusting step S32 is executed from among the repeated execution of the SiN step.

<Mechanism>

The mechanism, which enables control of in-plane distribution ox the thickness of an SiBN film by executing step S32 of adjusting the pressure in the process chamber 10 prior to the DCS gas supplying step S33, will be described.

Figure 9A:
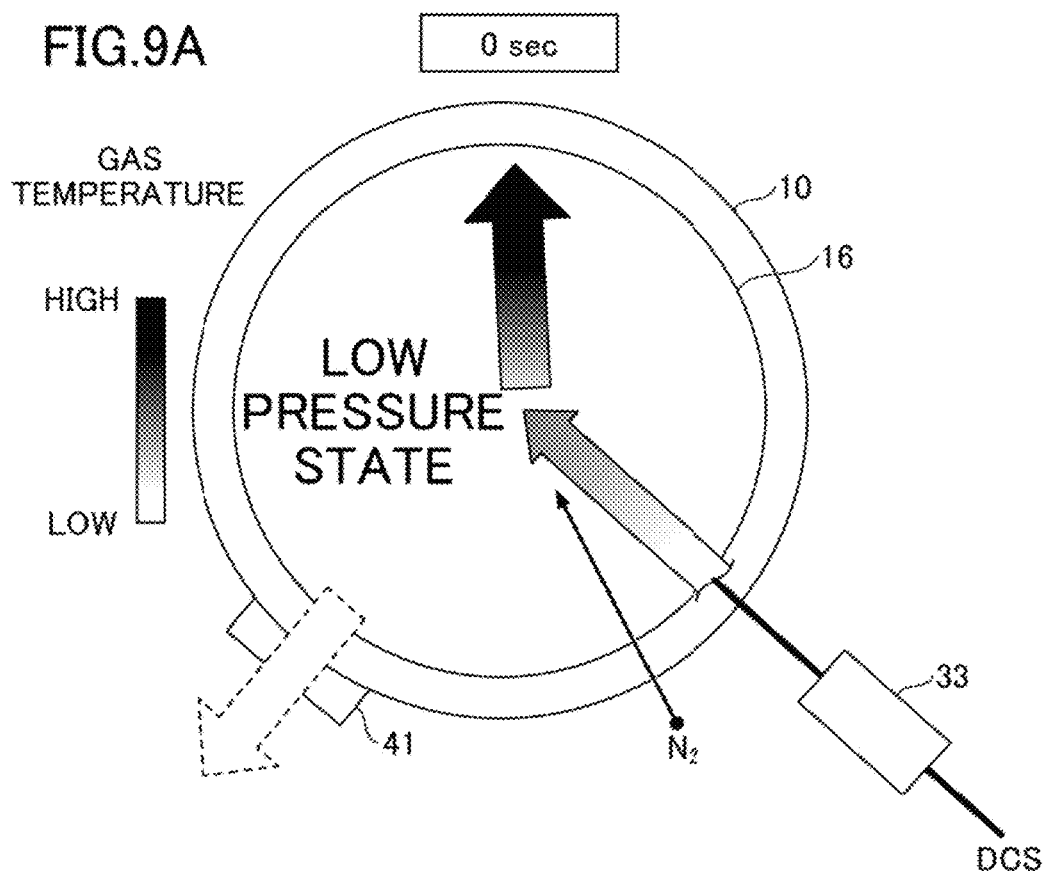
FIGS. 9A and 9B are diagrams explaining a mechanism for changing in-plane distribution of the film thickness.
Figure 9B:
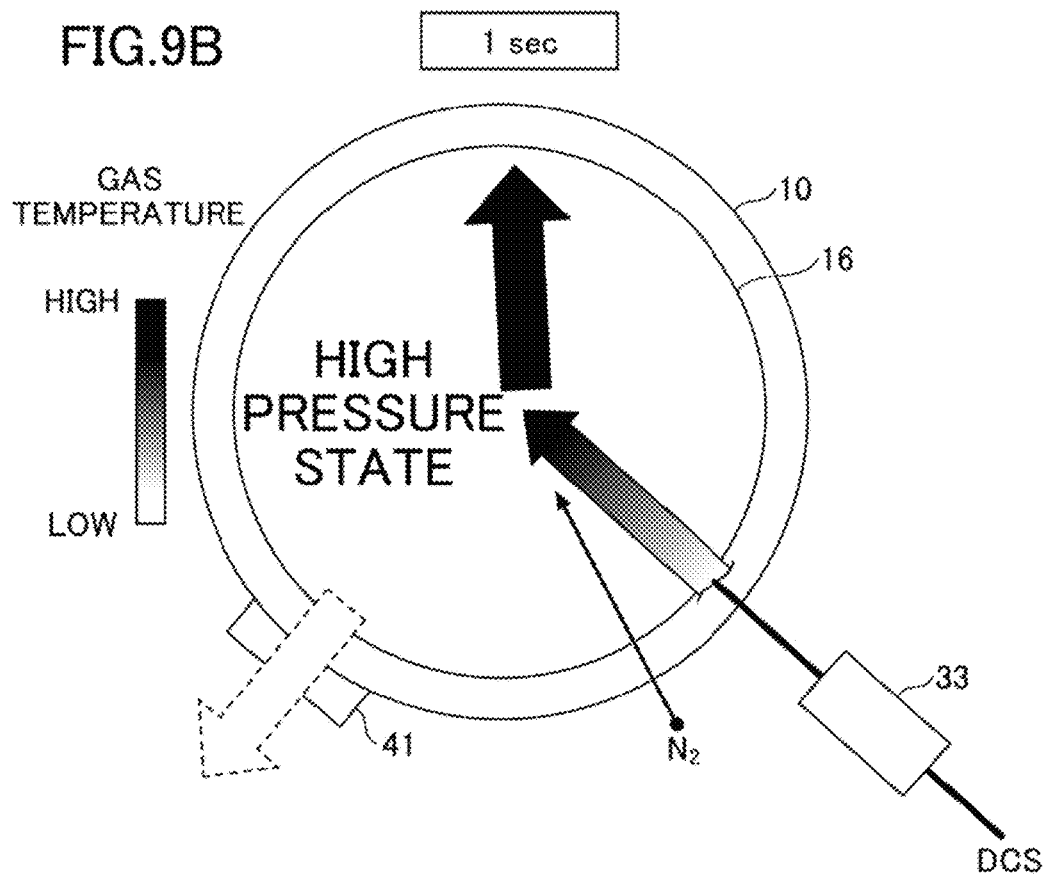

FIGS. 9A and 9B are diagrams explaining a mechanism for changing in-plane distribution of the film thickness. FIG. 9A illustrates the pressure and gas temperature in the process chamber 10 when the pressure adjusting step S32 is not performed before the DCS gas supplying step S33. FIG. 9B illustrates the pressure and gas temperature in the process chamber 10 when the pressure adjusting step S32 is performed for 1 second before the DCS gas supplying step S33.

As illustrated in FIG. 9A, if the pressure adjusting step S32 is not performed before the DCS gas supplying step S33, the process chamber 10 is in a low pressure state when the supply of DCS gas from a buffer tank 33 is initiated. As a result, because gas activation becomes slower and the gas flow rate becomes higher when supplying DCS gas, an amount of DCS gas adsorbed in the central region of the wafer W becomes less than that, in the outer peripheral region of the wafer W. Thus, it is inferred that this is the reason that the thickness of an SiBN film in the central region of the wafer W is smaller than that in the outer peripheral region of the wafer W.

In contrast, as illustrated in FIG. 9B, if the pressure adjusting step S32 is performed, the process chamber 10 is in a high pressure state when the supply of DCS gas from the buffer tank 33 is initiated. The high pressure state means that the pressure in the process chamber 10 is higher than that in a case in which the pressure adjusting step S32 is not executed. This results in faster gas activation and a lower gas flow rate when supplying DCS gas. Thus, as compared to a case in which the pressure in the process chamber 10 is low, an amount of DCS gas adsorbed in the central region of wafer W increases. Thus, it is inferred that the in-plane distribution of the thickness of an SiBN film is changed so as to increase the thickness of an SiBN film in the central region of the wafer W, compared to the case in which the pressure in the process chamber 10 is low.

In addition, the following inferences are made. In the pressure adjusting step S32 that is performed prior to the DCS gas supplying step S33, $N_2$ gas supplied in the process chamber 10 receives heat from the heater 50, thereby increasing the energy of $N_2$ gas. Thus, when DCS gas is supplied to the process chamber 10 in step S33, $N_2$ gas and DCS gas collide with each other in the process chamber 10, so that the temperature of DCS gas increases and activates easily. Therefore, in-plane distribution of the film thickness is changed so as to increase the thickness at the center of the wafer W.

As described above, the deposition method according to the present embodiment includes a first step of supplying a raw material gas in a process chamber, and a second step of supplying, in the process chamber, a reactant gas that reacts with the raw material gas. The deposition method according to the present embodiment performs multiple execution cycles serially. Each of the multiple execution cycles includes the first step and the second step, and at least one execution cycle of the multiple execution cycles may include a third step of adjusting a pressure in the process chamber without supplying the raw material gas. The third step is performed before execution of the first step. As the time for the third step of adjusting the pressure can be adjusted, or the number of cycles including the third step of adjusting the pressure among the multiple cycles can be adjusted, an amount of the raw material gas adsorbed in the plane of the wafer W can be controlled. As a result, in-plane distribution of the thickness of the film formed on the wafer W can be controlled. Also, because of the wide control area, it is easy to tune the film finely to the desired thickness.

Further, the deposition method according to the present embodiment can be realized by adding the step of adjusting the pressure to a conventional method, and it is not necessary to change a usage amount of a raw material gas or the hardware configuration of the deposition apparatus 1. Therefore, cost-effectiveness of the deposition method according to the present embodiment is high.

In the above-described embodiment, a silicon raw material gas and a metal raw material gas are examples of a raw material gas, and a nitriding gas and an oxidant gas are examples of a reactant gas.

The embodiment disclosed herein should be considered to be exemplary in all respects and not restrictive. The above embodiment may be omitted, substituted, or modified in various forms without departing from the appended claims and spirit thereof.

The above-described embodiment has described a case in which the process chamber is a single tube structure, but the present disclosure is not limited thereto. For example, the process chamber may be a dual tube structure.

The above-described embodiment has described a case in which a plasma is not used in the deposition apparatus, but the present disclosure is not limited thereto. For example, the deposition apparatus may be a device that utilizes a plasma, such as a capacitively coupled plasma (CCP) type processing apparatus.

The above-described embodiment has described a case in which the substrate is a semiconductor wafer but the present disclosure is not limited thereto. For example, the substrate may be a large substrate for a flat panel display (FFD), a substrate for an organic EL panel, or a substrate for a solar cell.

What is claimed is:

1. A method of depositing a film, the method comprising:
performing a plurality of execution cycles serially, each of the plurality of execution cycles including
supplying a raw material gas into a process chamber; and
supplying, into the process chamber, a reactant gas that reacts with the raw material gas; wherein
at least one execution cycle of the plurality of execution cycles includes
adjusting a pressure in the process chamber without supplying the raw material gas, the adjusting of the pressure being performed prior to the supplying of the raw material gas.

2. The method according to claim 1, wherein the adjusting of the pressure is performed by controlling a valve for adjusting exhaust conductance.

3. The method according to claim 2, wherein the adjusting of the pressure includes controlling opening of the valve to a same degree as the opening of the valve when the supplying of the raw material gas is performed.

4. The method according to claim 2, further comprising supplying a purge gas into the process chamber, the supplying of the purge gas being performed after the supplying of the reactant gas and before the supplying of the raw material gas in order to purge the reactant gas remaining in the process chamber; wherein the adjusting of the pressure includes controlling opening of the valve to a degree smaller than the opening of the valve when the supplying of the purge gas is performed.

5. The method according to claim 1, further comprising supplying a purge gas into the process chamber, the supplying of the purge gas being performed after the supplying of the raw material gas and before the supplying of the reactant gas in order to purge the raw material gas remaining in the process chamber.

6. The method according to claim 1, wherein each of the plurality of execution cycles includes the adjusting of the pressure.

7. The method according to claim 1, wherein
the process chamber accommodates a substrate; and
the raw material gas is supplied from a periphery of the substrate.

8. The method according to claim 1, wherein the raw material gas is pressurized in a buffer tank before the supplying of the raw material gas.

9. The method according to claim 1, wherein the process chamber can accommodate a substrate holding device configured to hold substrates substantially horizontally while the substrates are arranged at intervals in a vertical direction.

10. The method according to claim 1, wherein
the raw material gas is an aminosilane-based gas; and
the reactant gas is a nitriding gas.

* * * * *